United States Patent [19]

Suszko

[11] Patent Number: 4,623,255

[45] Date of Patent: Nov. 18, 1986

[54] METHOD OF EXAMINING MICROCIRCUIT PATTERNS

[75] Inventor: Stefan F. Suszko, Los Angeles, Calif.

[73] Assignee: The United States of America as represented by the Administrator, National Aeronautics and Space Administration, Washington, D.C.

[21] Appl. No.: 541,526

[22] Filed: Oct. 13, 1983

[51] Int. Cl.⁴ .............................................. G01B 11/00
[52] U.S. Cl. ................................................. 356/389
[58] Field of Search ................... 356/71, 388, 389, 394

*Primary Examiner*—R. A. Rosenberger

*Attorney, Agent, or Firm*—Paul F. McCaul; Thomas H. Jones; John R. Manning

[57] ABSTRACT

Examination of microstructures of LSI and VLSI devices is facilitated by employing a method in which the device is photographed through a darkfield illumination optical microscope and the resulting negative subjected to inverse processing to form a positive on a photographic film. The film is then developed to form photographic prints or transparencies which clearly illustrate the structure of the device. The entire structure of a device may be examined by alternately photographing the device and selectively etching layers of the device in order to expose underlying layers.

8 Claims, 14 Drawing Figures

Fig. 2a
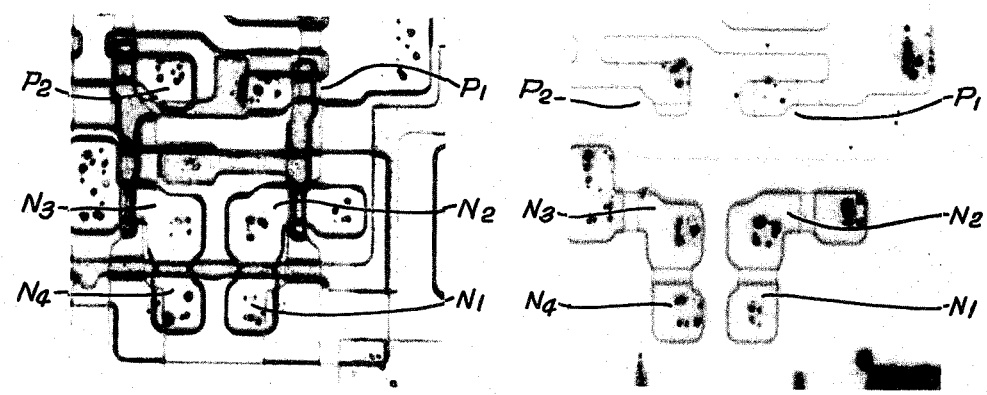
Fig. 2b
Fig. 3a
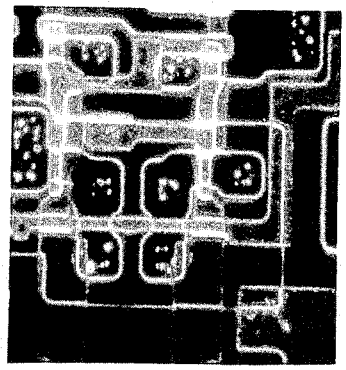
Fig. 3b
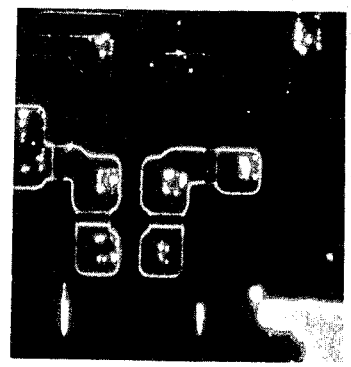
Fig. 4a
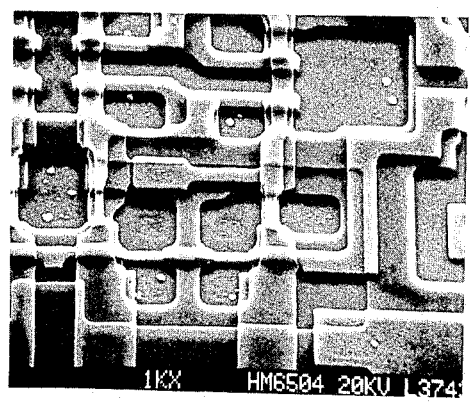
Fig. 4b
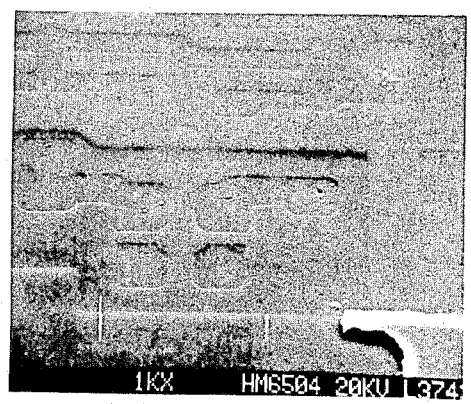

METHOD OF EXAMINING MICROCIRCUIT PATTERNS

ORIGIN OF THE INVENTION

The invention described herein was made in the performance or work under a NASA Contract and is subject to the provisions of Section 305 of the National Aeronautic and Space Act of 1958, public law 85-568 (72 STAT 435; 42 USC 2457).

BACKGROUND OF THE INVENTION

1. Field of the Invention

The present invention relates to an inverse photo development process resulting from optical photomicroscopy in darkfield illumination mode used in the examination and evaluation of LSIC/VLSIC (large scale and vary large scale integrated circuit) patterns and materials elements on a silicon chip. Such devices are multilayer structures defined and fabricated with aid of photomask patterns and successive etch-back materials process deposition steps by which these levels are precisely controlled (e.g., insulating oxides, doping pattern levels, implantations and diffusions, polysilicon gate patterns and metallization interconnects).

2. Description of the Prior Art

It is often necessary to physically evaluate LSIC/VLSIC devices for the purposes of product reliability assurance, validation of physical design and identification of device structural patterns. The most frequently used tool is a laboratory type optical microscope providing brightfield, contrast interference and darkfield modes of illumination; another tool is a scanning electron microscope (SEM) which is accurate and specific but more costly to use. It has been found that in the darkfield mode of optical examination of VLSIC chips the physical microstructure patterns corresponded more closely to photomask steps. The same pattern examples when viewed in the brightfield or contrast interference modes display unwanted fringe pattern effects resulting in distortions as to the physical definition of structures and materials when exposed in successive chemical etching steps while exposing the desired level for identification.

SUMMARY OF THE INVENTION

It is an object of the present invention to provide a method of examining semiconductor devices such as LSIC/VLSIC devices in such a manner that the microstructure of the devices is readily discernible and that the images obtained contain an absolute minimum amount of information unrelated to the patterns of the devices corresponding to masking operations. It is another object of the invention to suppress optical fringe pattern effects at materials interfaces when examining semiconductor devices. It is yet another object of the invention to provide images of semiconductor devices which closely correspond to mask patterns used to form such devices.

These and other objects are achieved by examining the structural build up of the LSIC/VLSIC devices layer by layer by photographing a device through an optical microscope used in the darkfield mode of illumination and inverse developing the photographs to obtain final images. The optical effect of photographing a device with darkfield illumination is an exposure which closely corresponds to the original photomasking pattern definition, which in turn with an inverse photo development process effectively and quite accurately replicates photographically the masks. A device to be examined is photographed through the microscope in order to obtain a negative containing a darkfield image. The negative is then subjected to inverse processing in order to form a positive image on a photographic film. Photoprints or transparencies may then be developed from the positive film.

After photographing the surface of a device, the layer of material corresponding to a particular masking process may be removed by selective etching techniques. The subsequent layer may then be photographed in order to determine the microstructure of that layer. Subsequent layers may be examined by alternately etching the device and photographing the exposed surface. The resulting photographs are positive prints or transparencies of mask-like quality which provide a level of detail unobtainable with other methods of optical examination. The method clearly displays metallization patterns, interlevel oxides, polysilicon and channel patterns, and substrate diffusions. The photographic results are an excellent aid in the VLSIC evaluation used in the validation of circuit design, reliability and failure analysis and are excellent for reverse engineering applications. When transparencies are produced from the positive images, the microstructure appears as black lines on the clear transparency. This resulting image is uniquely suitable for studying the build up of layers formed during successive masking operations. The transparencies may be overlaid with respect to each other in order to analyze the relative positions of elements formed during different masking operations. In both transparencies and prints, the clear and white backgrounds, respectively, make it very easy to label various elements in the photograph.

BRIEF DESCRIPTION OF THE DRAWINGS

The invention will now be described with reference to the accompanying figures, in which:

FIGS. 2a-b are darkfield inverse photographs of a memory cell of the type illustrated in FIG. 1 produced in accordance with the method of the present invention;

FIGS. 3a-b are darkfield photographs of the same memory cell;

FIGS. 4a-b are scanning electron microscope photographs of the same memory cell;

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined by reference to the appended claims.

Figure 1:
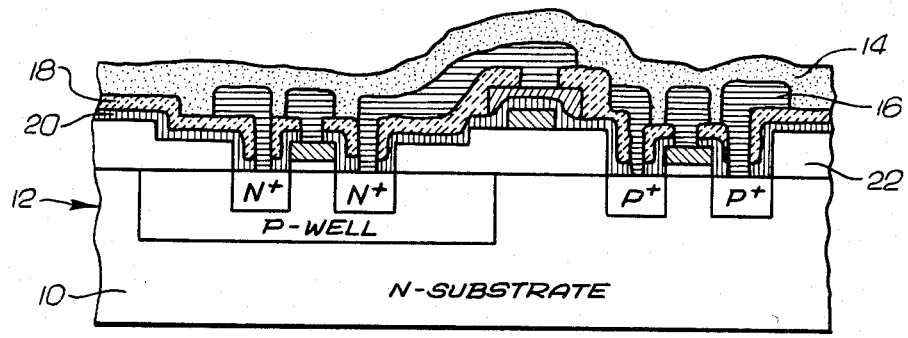
FIG. 1 is a cross section of MOS complementary transistors employed in a six transistor memory cell.

Referring to FIG. 1, a cross section showing a portion of a typical VLSIC device is shown. The cross section illustrates complementary transistors of a six transistor memory cell. The device is formed by well known mask exposure techniques in which diffusions 12 are defined in a substrate 10 by exposure of a photomask, and layers of various materials are built up with patterns contained on additional photomasks. In the structure shown, the device has a top passivation layer 14 of $SiO_2$, a metallization layer 16 defining contacts for the gate, drain and source areas of the transistors, dual polysilicon gate layers 18 and 20 and a thick field oxide layer 22.

In order to examine the device, various ones of the layers formed during the photomasking procedure may be removed by selective etching techniques so as to expose underlying layers. The exposed layers may then be photographed in accordance with the present invention.

The goal of the present invention is to provide photographs in which the structural details of the various layers defined by the masking process are more readily discernible and more conveniently studied than with prior art methods. This is accomplished by initially photographing the device using an optical microscope in the darkfield mode of illumination in order to produce negatives on a photographic film. Instead of normal developing, the negative is then subjected to inverse processing, i.e., the image on the negative is transferred to a second photographic film in order to form a positive image on the second film. The second film is then developed in a normal fashion in order to produce photographic prints or tranparencies. The inverse processing step provides photographs which are essentially comprised of a light background with the edges of patterns of the various layers being defined by dark lines.

FIG. 2a is a reproduction of a photograph of the device illustrated in FIG. 1 with the passivation layer 14 and metallization layer 16 removed to expose the two-level polysilicon layers 18 and 20 and the field oxide layer 22. The photograph illustrates a six transistor memory cell, and the location and configuration of each of the transistors is easily discernible from the photograph. The light background also facilitates direct labeling of various elements of the device, thus providing a substantial benefit in presentation and study of the photographs. In FIG. 2a, these transistors are labelled P1, P2, N1, N2, N3 and N4.

FIG. 2b is a darkfield inverse photograph of the device which was taken after selective etching to remove the polysilicon layers and the field oxide. Again, the photomask pattern which was used to form the diffusions is clearly discernible from the photograph. With the photographs having a light background and dark lines defining the edges of the microstructure formed by the mask photoexposure process. The method clearly displays metallization patterns, interlevel oxides, polysilicon and channel patterns, and diffusions.

In the examination of the microstructure various layers of a device, it may be desirable to study the microstructures as they relate to each other. The method of the present invention facilitates such study. When transparencies are produced in accordance with the present invention, they will consist of a tranparent background and dark lines defining the edges of elements of the microstructure of the layer being photographed. Transparencies representing different layers of the device may be overlaid with one another in order to study the interrelationships between the layers.

The photographs of FIG. 2 may be compared with those of FIG. 3, in which photographs of the same structure were produced by using the microscope in its darkfield mode of illumination and directly processing the negatives to form prints. Although the structural details which are visible are the same as with the present invention, the photgraphs are not as convenient to study or label. Furthermore, it is impossible to study the structural relationship between layers, since transparencies would be substantially black and would therefore block out any underlying transparencies.

FIGS. 4a and 4b are reproductions of scanning electron microscope photographs of the device corresponding to FIGS. 2a and 2b, respectively. As can be seen from a comparison of the darkfield inverse and SEM photographs, the structural detail revealed by photos produced in accordance with the present invention compares very favorably with those produced with a scanning electron microscope. In some instances, the microstructure is even more clearly illustrated by employing the method of the present invention as compared to the use of the SEM.

Figure 5:
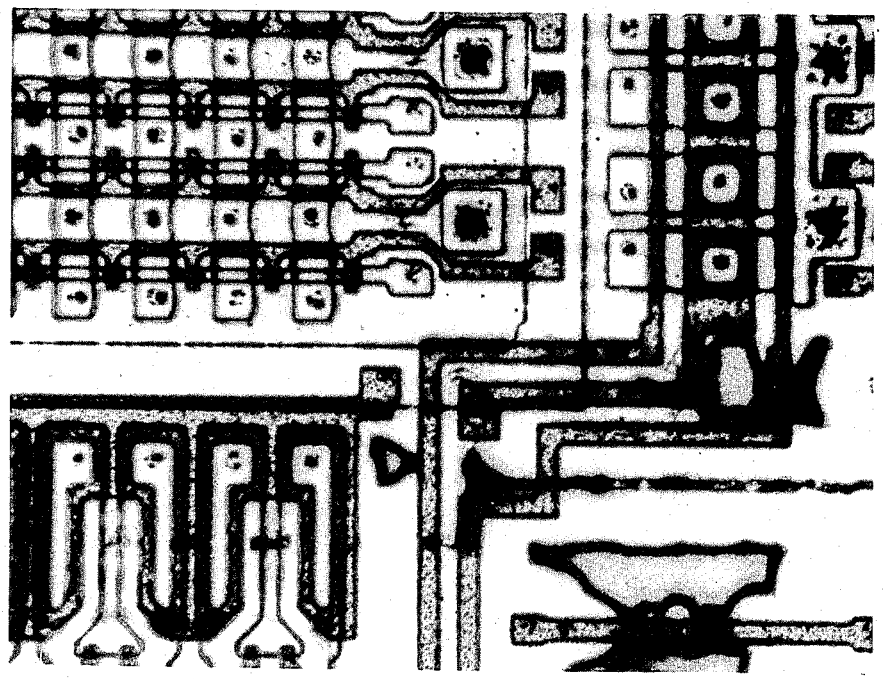
FIG. 5 is a darkfield inverse photograph of a memory device made in accordance with the present invention.
Figure 6:
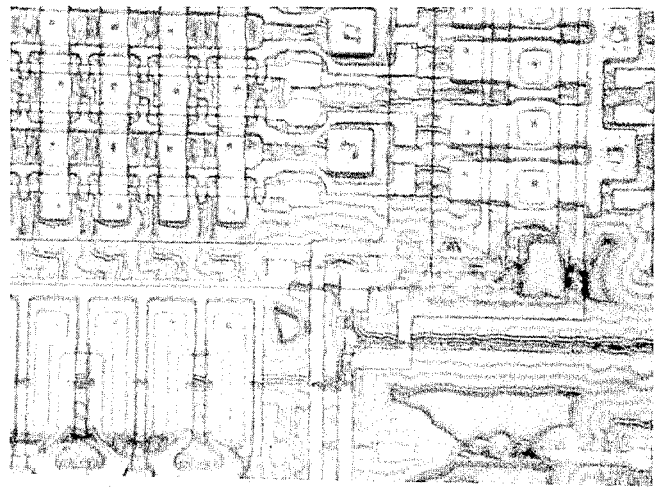
FIG. 6 is a brightfield photograph of the same device portion shown in FIG. 5.

FIGS. 5 and 6 are reproductions of a darkfield inverse photograph made in accordance with the present invention and a brightfield photograph of the same portion of a read only memory (ROM) cell chip segment, respectively. In these photographs, the metallization layer has been removed and the two-level polysilicon, field oxide and contact patterns are exposed. In FIG. 5, the patterns defined in the photomask exposure processes are clearly evident, and the photograph contains only minimal information which is not related to the microstructure of the device. In contrast, in FIG. 6 the microstructure of the device is almost completely undiscernible, due to optical fringe effects to the layer interface and various other forms of interference which distort the image.

Figure 7A:
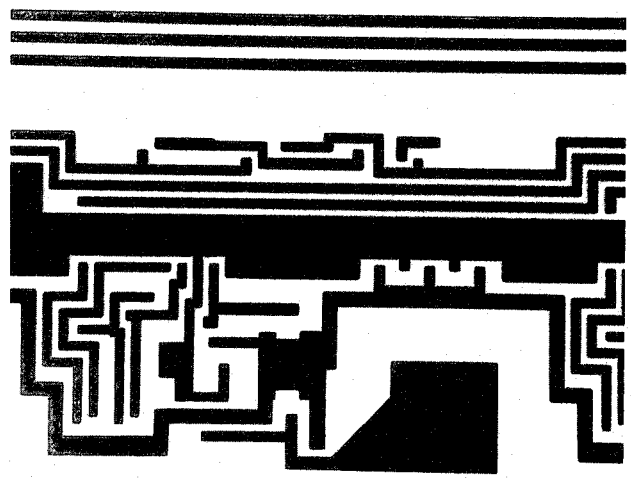
FIGS. 7a-c are photographs of mask patterns used to form a semiconductor device.
Figure 7B:
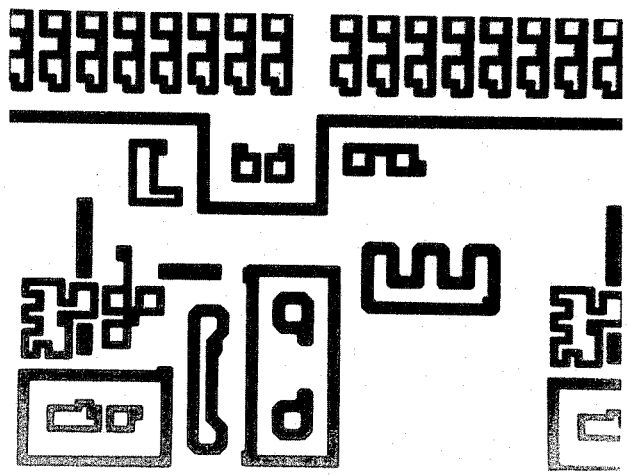
Figure 7C:
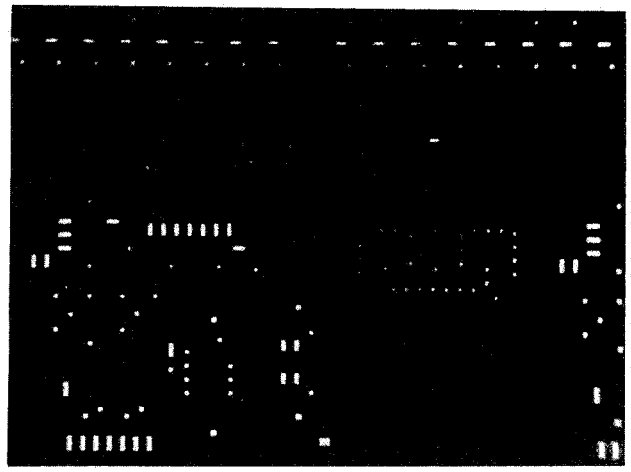
Figure 8A:
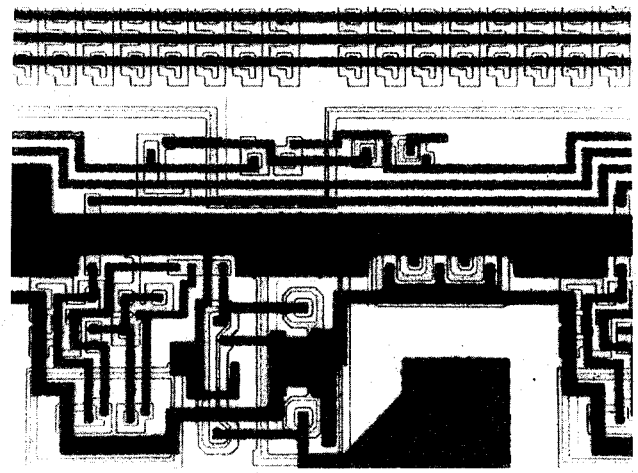
FIGS. 8a-b are darkfield inverse photographs taken in accordance with the present invention of a device formed utilizing the masks of FIGS. 7a-c.
Figure 8B:
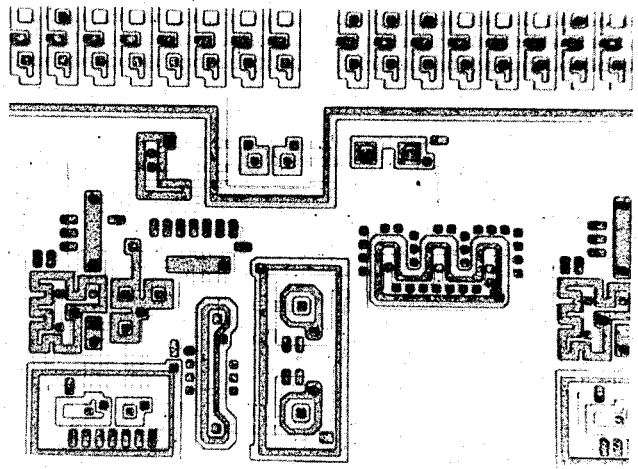

FIGS. 7 and 8 illustrate the extremely close correspondence between photographs produced in accordance with the present invention and the original mask patterns which are used to form a semiconductor device. FIGS. 7a–c are photographs of the metallization mask, polysilicon mask and contacts aperture mask, respectively, of a segment of a CMOS input buffer. FIG. 8a is a reproduction of a photograph made in accordance with the present invention, i.e., a photograph was taken through a darkfield optical microscope to form a negative, the negative inverse processed to form a positive, and the positive used to print the photograph. In this photograph, the metallization pattern corresponds extremely closely to the metallization mask shown in FIG. 7a. In FIG. 8b, the metallization has been removed by selective etching, and the patterns of the interlevel oxide, polysilicon and contacts are clearly recognizable and may be directly compared to the mask patterns shown in FIGS. 7b and 7c.

In order to obtain the best possible photographs, the etching steps to remove layers of a device must be carefully controlled so as to minimize the degradation to patterns which are to be examined and identified. Attention to the timing of the etch process is the most important condition in assuring the integrity of stripping and the subsequent exposure process.

Thus, the present invention provides a means for quick identification of the design of physical structures and materials process levels related to photomask patterns. Photographs may be produced in which the lateral outlines of microstructures are sharp and specific, relating closely to the mask patterns and materials. Details and dimensions correspond closely to similar patterns displayed in scanning electron microscope photographs. Optical fringe pattern effects displayed in exposed oxides and nitrides when using brightfield illumination are eliminated.

Although a scanning electron microscope will typically provide excellent topographic characteristics when used at relatively high magnifications (1000× and above) lower magnifications of 500× and below will not accurately display various structures. In addition, SEM scanning of smooth planar silicon chip areas covered by insulating oxides and nitrides does not clearly, if at all, reveal the presence of diffusions and implantation patterns in epi or silicon substrates.

In reliability and product assurance development, clear optical photo definitions are critical in order to present the interface of exposed material levels which correspond closely to design mask patterns. The darkfield photographic and inverse processing method, as well as being cost efficient, achieves this uniform pattern reproducibility on all levels and with improved analytical quality.

What is claimed is:

1. A method for examining the architecture of multiple layer semiconductor devices formed by successive exposure of mask patterns in an overlapping fashion, comprising the steps of:
   photographing a selected portion of a semiconductor device with a darkfield illumination microscope to form a negative on a first photographic film;
   inverse processing said negative to form a positive image on a second photographic film; and
   developing a photograph from said second photographic film.

2. A method according to claim 1 including the step of forming a photographic print from said second film.

3. A method according to claim 1 including the step of forming a photographic transparency from said second film.

4. A method according to claim 1 including the steps of selectively removing layers of the semiconductor device formed by exposure of successive mask patterns in order to reveal elements formed in the semiconductor device during successively earlier exposure steps, photographing the semiconductor device after the removal of each layer, and inverse processing the negative to form positive images.

5. A method of examining a semiconductor device comprising the steps of:
   providing a semiconductor device having an upper layer formed by exposure of a first mask pattern;
   photographing said upper layer through a darkfield illumination microscope to form a negative image thereof on a first photographic film;
   inverse processing the negative to form an inverted positive image on a second photographic film;
   removing the upper layer to expose a second layer of the semiconductor device formed by photoexposure of a second mask pattern;
   photographing the second layer through a darkfield illumination microscope to form a negative image thereof on a third photographic film;
   inverse processing the third film to form an inverted positive image on a fourth photographic film; and
   developing the second and fourth films to form photographs.

6. A method according to claim 5 including the steps of removing at least one additional layer of the semiconductor device formed by photoexposure of additional mask patterns photographing the exposed layers and inverse processing and developing films to obtain photographs of the additional layers.

7. A method of examining the microstructure of semiconductor devices such as LSIC and VLSIC devices having a plurality of layers of material formed by means of successive exposure of mask patterns in an overlapping fashion, comprising the steps of:
   photographing an upper surface of a semiconductor device through a darkfield microscope to form a negative, said upper surface having a first layer of material formed by means of exposure of a first mask pattern;
   selectively etching the semiconductor device to remove the first layer;
   photographing the upper surface of the semiconductor device through a darkfield microscope to again form a negative, said upper surface having a second layer of material formed by means of exposure of a second mask pattern;
   selectively etching the upper surface of the semiconductor device to sequentially remove additional layers of material;
   photographing the upper surface of the semiconductor device through a darkfield microscope after the removal of each layer of material to form additional negatives, the upper surface in each photographing step having a layer of material formed by means of exposure of additional mask patterns;
   inverse processing the negatives to form positives on photographic film, said positives containing images which substantially correspond to the mask patterns; and
   developing the film containing the positive images to form photographs.

8. A method according to claim 7 including the step of forming photographic prints from said positives.

* * * * *